United States Patent
Rone, Jr.

(10) Patent No.: US 10,185,785 B2
(45) Date of Patent: Jan. 22, 2019

(54) SYSTEM AND METHOD FOR TRACKING COMPONENTS OF COMPLEX THREE DIMENSIONAL STRUCTURES

(71) Applicant: RefraResources LLC, Vancouver, WA (US)

(72) Inventor: Kenneth J. Rone, Jr., Vancouver, WA (US)

( * ) Notice: Subject to any disclaimer, the term of this patent is extended or adjusted under 35 U.S.C. 154(b) by 1454 days.

(21) Appl. No.: 13/862,299

(22) Filed: Apr. 12, 2013

(65) Prior Publication Data

US 2013/0289949 A1 Oct. 31, 2013

Related U.S. Application Data

(60) Provisional application No. 61/623,525, filed on Apr. 12, 2012.

(51) Int. Cl.
*G06F 17/50* (2006.01)
*G06Q 10/08* (2012.01)

(52) U.S. Cl.
CPC ......... *G06F 17/50* (2013.01); *G06Q 10/0875* (2013.01)

(58) Field of Classification Search
None
See application file for complete search history.

(56) References Cited

U.S. PATENT DOCUMENTS

| | | | | |
|---|---|---|---|---|
| 5,966,134 A * | 10/1999 | Arias | ........ | G06T 13/20 345/426 |
| 9,158,865 B2 * | 10/2015 | Bisson | ........ | G06F 17/50 |
| 2009/0102844 A1 * | 4/2009 | Deparis | ........ | G06T 15/50 345/426 |
| 2009/0128562 A1 * | 5/2009 | McCombe | ........ | G06T 15/06 345/427 |
| 2009/0167763 A1 * | 7/2009 | Waechter | ........ | G06T 15/06 345/426 |
| 2009/0262132 A1 * | 10/2009 | Peterson | ........ | G06T 15/005 345/619 |
| 2011/0137892 A1 * | 6/2011 | Bisson | ........ | G06F 17/50 707/722 |

(Continued)

OTHER PUBLICATIONS

Mora et al. A New Object-Order Ray-Casting Algorithm Proceedings of the conference on Visualization, 2002, pp. 203-210.*

(Continued)

*Primary Examiner* — Aniss Chad
*Assistant Examiner* — Cuong V Luu
(74) *Attorney, Agent, or Firm* — Rylander & Associates PC; Philip R. M. Hunt

(57) ABSTRACT

A build-out tracking method and application tracks historical changes within a complex and/or repeatedly modified structure and provides for queries about the build-out of the structure over time. The method returns precise installation data from any spatial point the user chooses to query within the structure by creating a ray that pierces the structure and collects data along its path. This returned data is an immediate record of current in situ and legacy configurations of any and all shape geometries, solving the technical problem created when a surface cannot be rendered into the traditional zero-Gaussian developed surface (upon which the prior art relied). Legacy parts, designs and materials can be evaluated for life-cycle service enabling optimization of the design in support of continuous improvement.

9 Claims, 15 Drawing Sheets

(56) References Cited

U.S. PATENT DOCUMENTS

2013/0141428 A1* 6/2013 Gipson ................ G06T 19/003
　　　　　　　　　　　　　　　　　　　　　345/419

OTHER PUBLICATIONS

Sramek et al. Fast Ray-Tracing of Rectilinear Volume Data Using Distance Transforms IEEE Transaction on Visulization and Computer Graphics, vol. 6, No. 3, Jul. 2000.*
Wang et al. Volume-Sampled 3D Modeling IEEE Computer Graphics and Applications 1994, pp. 26-32.*

* cited by examiner

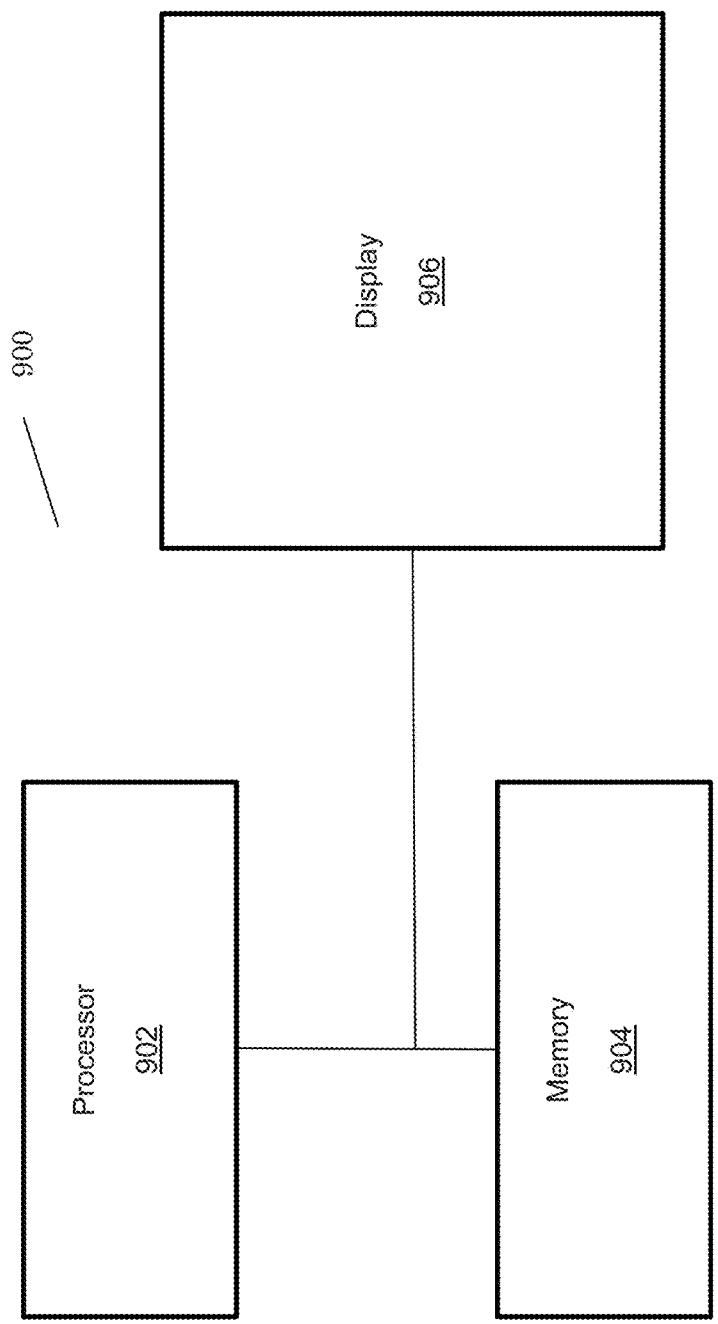

SYSTEM AND METHOD FOR TRACKING COMPONENTS OF COMPLEX THREE DIMENSIONAL STRUCTURES

CROSS-REFERENCE TO RELATED APPLICATION

The present application claims the benefit of and priority to U.S. Provisional Application No. 61/623,525 filed on Apr. 12, 2012, incorporated herein by reference.

FIELD OF THE INVENTION

The present invention relates to methods for tracking wear components. More particularly, the present invention relates to a method for tracking wear components of structures with complex three dimensional shapes.

BACKGROUND

Industrial structures frequently comprise wear components in parts of the structures that are subjected to erosion and wear. These wear components are designed to be relatively easy to replace when they wear out. An operator of such industrial structures often finds it advantageous to track information about the wear components used. This information can be used to operate the structure more efficiently. The operators can experiment with wear components from different suppliers with different designs or materials to find which work best in particular locations within the structure.

One industrial structure in particular need of tracking its wear components is a rotary cement kiln. A rotary cement kiln comprises a tube made from steel plate, and lined with refractory material. The tube slopes slightly (1-4°) and slowly rotates on its longitudinal axis at between 30 and 250 revolutions per hour. Rawmix (typically a mixture of limestone and clay or shale) is fed in at the upper end, and the rotation of the kiln causes it gradually to move downhill to the other end of the kiln. Fuel, in the form of gas, oil, or pulverized solid fuel, is blown in at the other end through the "burner pipe", producing a large concentric flame in the lower part of the kiln tube. As the rawmix moves under the flame, it reaches its peak temperature, changing into clinker (alite and other compounds) before dropping out of the kiln tube into a cooler. A typical rotary cement kiln also has some auxiliary components such as preheaters. A typical preheater is designed as a "cyclone"—a conical vessel into which a gas-stream from the kiln tube is passed tangentially while the rawmix is fed in through the top of the cyclone.

'Constructs' and 'build-outs', as these terms are used herein, represent physical structures where multiple components (i.e., parts) are combined in intimate contact one to another. Components have one or more faces (i.e., surfaces), with a 'cold face' closest to the outer skin of the structure and a 'hot face' furthest from the outer skin. These components can be of the same material, though of different design; or conversely, similar design with different material. A 'configuration' represents a structure at a specific point in time, in which the components have specific designs and/or materials. A 'build-out' represents multiple, sequential configurations of the structure across time. One configuration of a build-out may have some components with different designs and/or materials than a configuration of the build-out at a different point in time. The entire build-out becomes an intimate composite of differing components and/or common components in varying arrangements. A Lego® structure would be an every-day example where design (i.e. shapes), properties (i.e. color) and components (i.e. gears, mini-figures, etc.) vary throughout the construct while comprising the finished composite. At any time a change in component design, color or arrangement can be made to the build-out, creating a different configuration. These changes might be for purposes of improvement, the ending of a component's useful life or perhaps by whim. Regardless, the documentation (e.g. where, when, with what) of such changes, even when internal to the structure, is desirable.

Previously, the evaluation of life-cycle economics of wear components has been performed using spread sheet or data base applications to store all descriptive data of the progressive re-design or repair of such build-outs (dimensions, physical properties materials, failure rates, installation dates, replacement dates, installation contractors, costs, etc.). Algorithms could query the data to generate solutions to assist in effecting continuous improvements to the economic life of the structure.

More recently, the data was enhanced with graphical 2D representations of historic or in situ configurations thru software such as that offered by WinBrix® and ECS/CemScanner® allowing the visual/spatial embellishment of the data returned from the software's algorithms. The 2D representations are represented via simple 'developed surfaces' (ones with zero-Gaussian curvature that can be flattened onto a plane without distortion) projecting the entire build-out in a single 2D view, color coded to represent different materials and their geometric relationship to each other (FIGS. 5 & 7). The '2D Method' becomes cumbersome and eventually loses utility as shapes become more complex. The '2D method' as programmed in these products limits itself to cylindrical surfaces. By definition, spheres and domes are not developable surfaces under any metric as they cannot be 'unrolled' onto a plane.

Both ECS/CemScanner® and WinBrix® can present a 3D orthogonal displaying the measured radiation loss (color coded) on a rotating cylindrical surface juxtaposed by an adjacent linear 2D depiction of the refractory configuration (See attached Graphical User Interface (GUI) images attached in FIGS. 6 & 8). Regarding non-cylindrical (non-zero-Gaussian) bodies, neither product models them, or depicts entity placement in 3D or manages composite (with stacked or 'sandwiched' components) build-outs or displays point-based historical data The ECS/CemScanner® package offers prediction of in situ component thickness (to highlight the concern about component reduced by wear), by correlating radiation loss measured with an infrared scanner to knowledge of the in situ configuration stored in its database.

What is needed is a method and system in which non-cylindrical (non-zero-Gaussian) bodies are modeled, depicting component placement in 3D, managing build-outs and displaying point-based historical data.

SUMMARY AND ADVANTAGES

The present invention is a build-out tracking method and application tracks historical changes within a complex and/or repeatedly modified structure and provides for queries about the build-out of the structure over time. The build-out tracking application/method solves the problem presented by complex shapes and surfaces with Gaussian curvature.

The present invention comprises methods which allow the return of precise documentation of build-outs of complex structures, noting any historical change within such as replacing components with components of different materials, parts or designs (in part or in whole) or merely replacing components in-kind. The method identifies precise configuration and component data at any spatial point in the build-out that the user chooses to query. The methods allow an immediate record of current in-situ configuration and further returns data whereby legacy parts, designs and materials can be evaluated for life-cycle economics. This enables optimization of design and performance of the modeled structure in support of continuous improvement. The methods facilitate the visualization and analysis of complex geometric shapes via 3D parametric modeling.

Typical application of these methods are on structures/entities/composites where re-configuration and design change is recurrent and most useful where future decisions are predicated on the understanding of past performance of the individual components. The methods also apply where unpredictable environmental conditions challenge current practice or where changes in technology might provide encouragement in the form of improved (but uncertain) service going forward. The methods are also applicable where the art is such that improvements are made through trial and error. Examples are the NASA Space Shuttle heat shielding, interstate highway pavement repairs, built up roofs and in the case of the primary embodiment discussed herein, the performance of refractory insulation containing high temperature thermal processes.

BRIEF DESCRIPTION OF THE DRAWINGS

The present invention will be described by way of exemplary embodiments, but not limitations, illustrated in the accompanying drawings in which like references denote similar elements. The accompanying drawings, which are incorporated into and constitute a part of this specification, illustrate one or more embodiments of the invention and, together with the detailed description, serve to explain the principles and implementations of the invention.

FIG. 15 shows a computer system with a processor, memory and a display.

DETAILED DESCRIPTION

Before beginning a detailed description of the subject invention, mention of the following is in order. When appropriate, like reference materials and characters are used to designate identical, corresponding, or similar components in different figures. The figures associated with this disclosure typically are not drawn with dimensional accuracy to scale, i.e., such drawings have been drafted with a focus on clarity of viewing and understanding rather than dimensional accuracy.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Use of directional terms such as "upper," "lower," "above," "below", "in front of," "behind," etc. are intended to describe the positions and/or orientations of various components of the invention relative to one another as shown in the various Figures and are not intended to impose limitations on any position and/or orientation of any embodiment of the invention relative to any reference point external to the reference.

Figure 1:
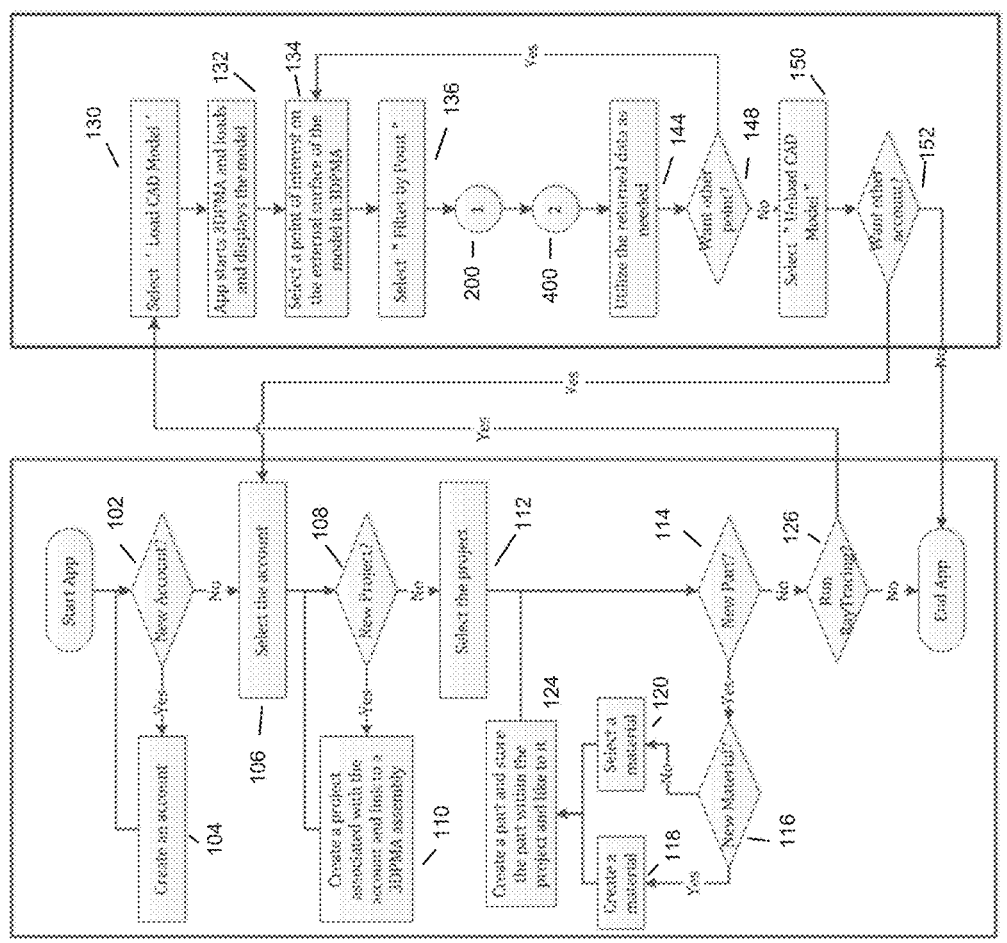
FIG. 1 is a flow chart showing a build-out tracking method.

FIG. 1 is a flow chart showing a build-out tracking method 100 that includes a ray tracing filter method 200 a matching method 400 for match parts filtered from ray tracing filter method 200 with information about the parts in a 'Parts' database. The ray tracing filter method 200 has steps that 'pierce' the surface of a model of a build-out at any spatial point and identify all components and entities ever situated along the path of the 'piercing ray' and thus return details of their installation and service-life as retrieved from a database. Both methods are executed on a computer system 900 with a processor 902, memory 904 and a display 906 (FIG. 15).

Figure 9:
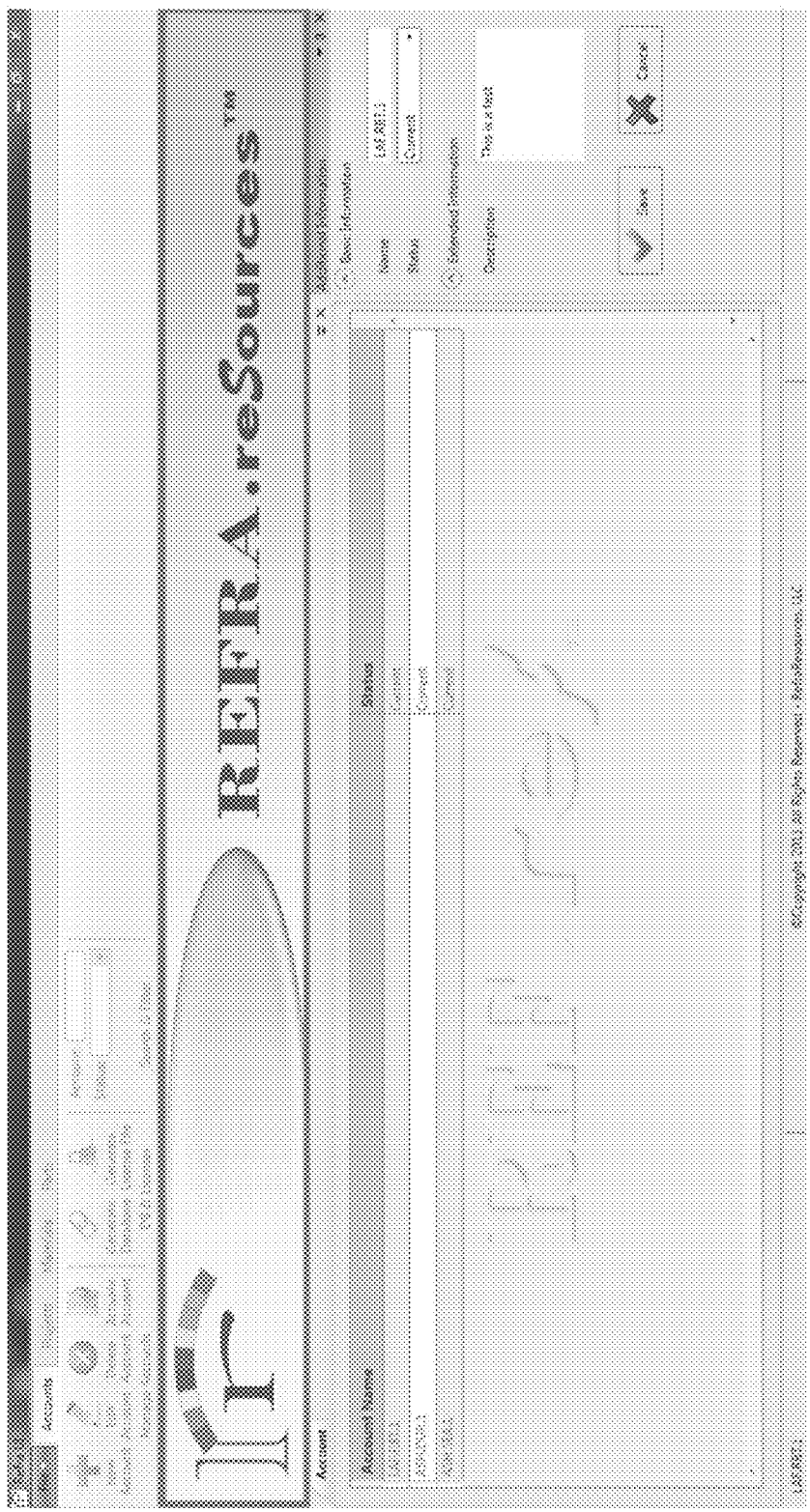
FIG. 9 shows an 'Accounts' GUI for application performing the build-out tracking method.

The build-out tracking method calls on a 3D parametric modeling application (3DPMA). The 3D parametric modeling application generates accurate 3D parametric models of various components which when combined, create a built-out model accurately representing the structure. The build-out is modeled in three dimensional space relative to a field-established reference datum. Previous configurations in the built-out are similarly modeled and compiled as part of a project 'Assembly'. Care is taken to differentiate physical and design differences between any non-similar components or non-contiguous components and thus creating discrete components in each case. The 'Assembly' is accessed from memory organized under a 'Project' directory. These tasks are performed with commercially available parametric modeling software Account Creation, Account Selection and Accounts GUI The build-out tracking method begins by presenting a graphical user interface (GUI) (see FIG. 9) which prompts the user for establishment or retrieval of unique 'Account' information (Step 102). A new account command can be triggered from the Command Ribbon icon 'New Account' (Step 104). A Flyout box appears requesting name, status (Expired or Current) and description of the account. The entered information is saved by the user selecting a 'Save' icon. The account is thus established and displayed as a row on the GUI table by 'Account Name' and Status. Alternately, the 'Cancel' icon can be selected by the user, erasing the entry.

In cases where an account is already established, the GUI allows selection of that existing account within the table (Step 106). Existing accounts can be selected by the user selecting the table entry allowing editing capability via the 'Edit Account' icon in the Command Ribbon and modified within the Flyout. Further toolbar actions will reference the existing account that was sourced within this table. Active selections are limited to one account at a time and represented by background shading (blue) along the table row. Accounts can similarly be deleted via the 'Delete Account' icon at which time a confirming dialogue box appears requesting further confirmation of the exact account to be deleted which can be accepted ('OK') or cancelled ('Cancel'). The GUI also provides table 'Search & Filter' capability by 'Account' or 'Status'. From the toolbar icons allow actions to 'Generate Database' and 'Generate License File'. Entries are saved into the database upon the user selecting the 'Save' icon in the associated Flyout box.

The Flyout box can, at the user's option, be 'pinned' open and/or laterally expanded to occupy a greater part of the window. If pinned, the expansion proportionally shrinks the GUI table while the toolbar ribbon remains unchanged. If unpinned, an expansion of the Flyout box will not shrink the GUI table display but rather overlay it. Also in its unpinned state, by selecting any field within the GUI table the Flyout box will dissolve laterally with an 'Additional Information' tab remaining displayed. Selecting the tab will redisplay the box to its last displayed size in the unpinned state. Pinning immediately opens the box to the dimension set at the last pinning up to a maximum display setting (and laterally shrinking the GUI table at the same time).

Project Creation, Project Selection and Projects GUI

Figure 10:
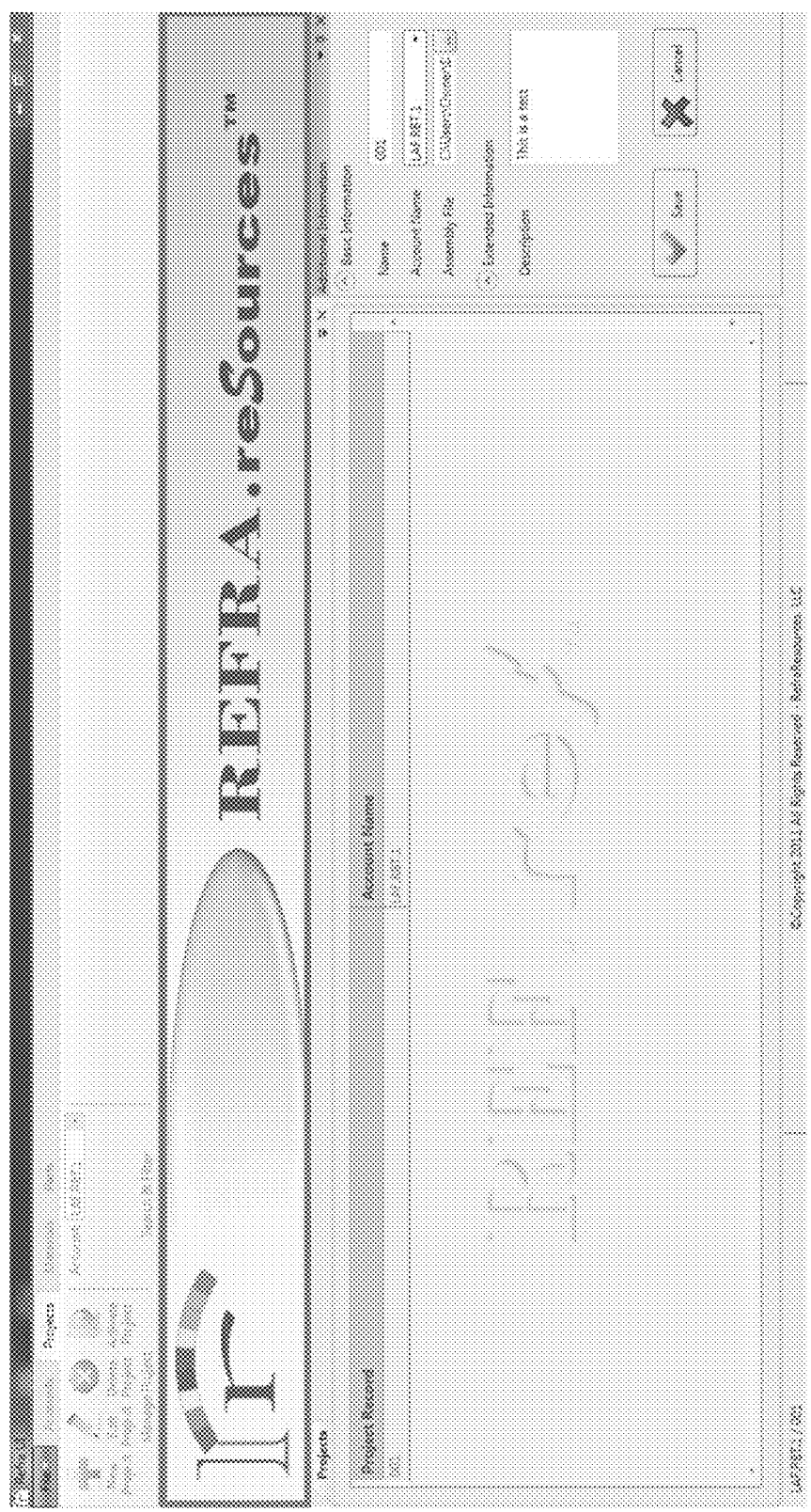
FIG. 10 shows a 'Projects' GUI displayed by an application performing the build-out tracking method.

The build-out tracking method provides for the establishment of 'Projects'. 'Projects' are sub-directories to 'Accounts' and define discrete assemblies independent of other constructs. They also may be 'carve-outs' intended to provide more detail than appropriate for a greater construct of which the carve-out is a sub unit. The 'Project' GUI (see FIG. 10) is displayed by selecting the 'Projects' tab on the toolbar. The table displays two columns titled 'Project Record' (a user-defined name entered in the Flyout box) and the 'Account Name' from the associated Account. The 'Account' defaults to the one selected in the previous tab, or one designated in the Account text box on the Command Ribbon. This text box provides a drop down list to display accounts and projects or just projects from a selected account. 'Projects' are established ('New Project' icon), edited and deleted much like is done with 'Accounts'. The user can 'Save' or 'Cancel' a project, similarly, within the Flyout box.

A new Project command can be triggered from a Command Ribbon icon 'New Project' (Step 108). In addition to the steps establishing a 'New Account' described above, a key step necessitated to establish a 'Project' is to link the 'Project' to an 'Assembly File' held in memory and accessed by defining its path in the Flyout's text box or selecting a browse button '. . . ' (Step 110). This step designates the location in memory of the build-out that the build-out tracking method will display as described later.

Once there is at least one project available, the user can select a project (Step 108).

Parts Creation, Parts Selection and Parts GUI

Figure 11:
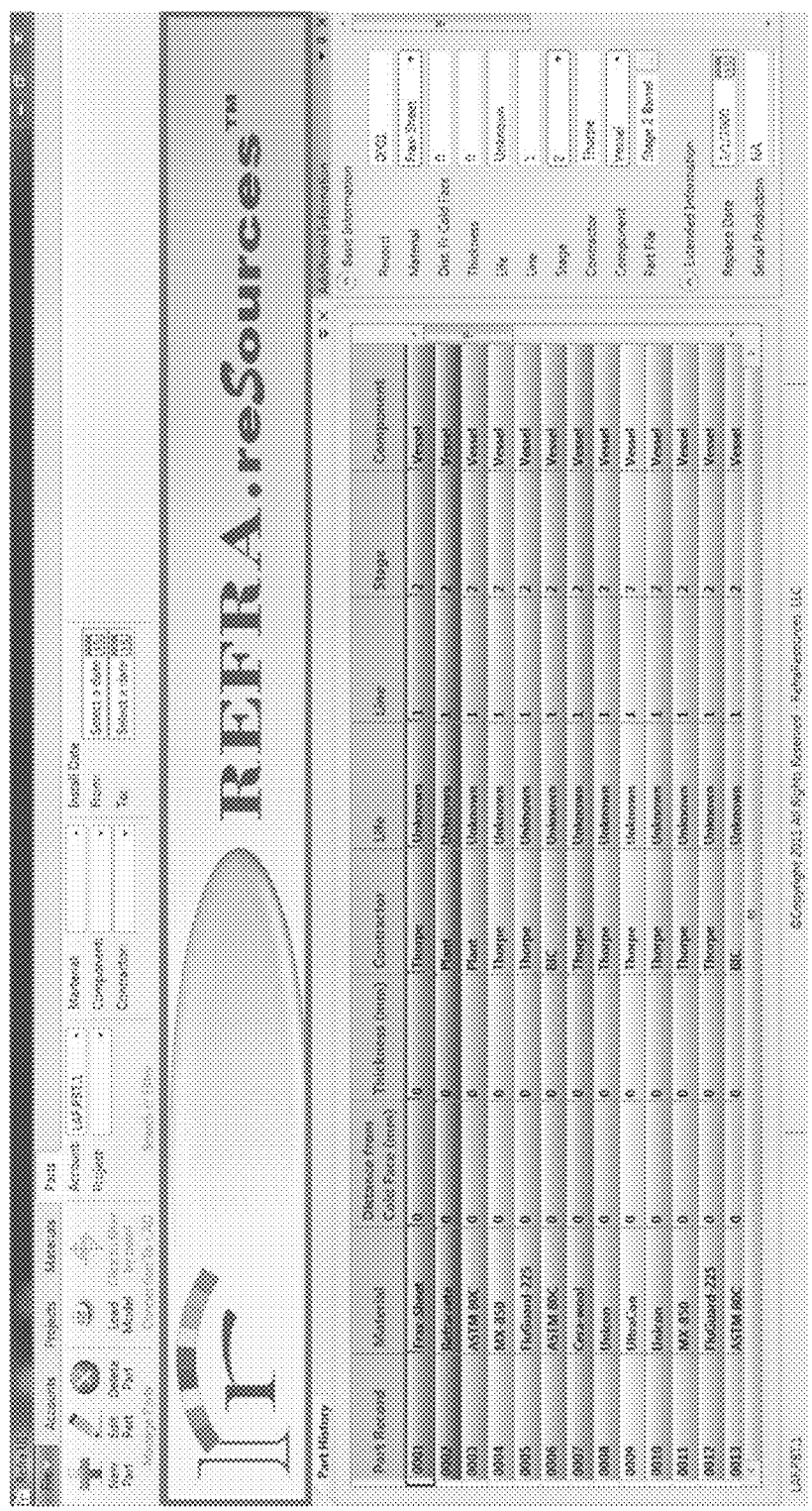
FIG. 11 shows a 'Parts' GUI displayed by an application performing the build-out tracking method.

The build-out tracking method provides for the creation of new parts (i.e., components). The method relies on establishing the location (in memory) of the parametric 3D models of individual parts that comprise the build-out model to be analyzed. The 'Parts' GUI (see FIG. 11) is displayed by selecting the 'Parts' tab on the toolbar. Creating a new part in the database can be done from the Command Ribbon icon 'New Part' (Step 114). Critical part data, of interest to the user, is entered in the Flyout box entries. The GUI table displays multiple columns and a color shaded row. Shade coloring is user-defined designating the material the part is made from. A given row defines the 'Part Record' which is the name given to the part and defined by the user in the text box in the Flyout.

The 'Material' column entry is derived from the predefined selection offered in the dropdown box within the Flyout. The user decides (Step 116) whether to use one of the predefined materials (Step 118) or create a new material (Step 120). Materials are created, and thus included on the 'Part Record Flyout' dropdown list, via the 'Materials' GUI described later.

The 'Distance from Coldface (mm)' column represents the extension in millimeters of the closest face of the part to the outer skin of the structure (defined as the 'Coldface' and equaling zero if it is the outer skin) when measured normal to that skin. Thus 'Parts', by definition, must lie parallel to the 'Coldface' when measured from any point normal to the Coldface and while the normal direction intersects the part.

The 'Thickness (mm)' column represents the continuation of the 'Distance from Coldface' dimension and is the distance in millimeters of the furthest face of the part from the outer skin of the structure ('Coldface) when measured normal to that skin. The 'Thickness' of a 'Part' is constant.

The 'Contractor' is the contractor most responsible for the installation of the part. If it is installed by in-house labor, 'Plant' is entered and displayed. These entries are made within the Flyout box.

The 'Line' is a designator, loosely referring to a discrete production line, that further clarifies the area within an individual account's asset base where the 'Project' occurs and entered in the Flyout box The 'Stage' and 'Component' designators further clarify the location within the 'Line' where the 'Part' is located. These are selected from dropdown lists within the Flyout box.

'Parts' are created, edited and deleted much like is done with 'Accounts' and 'Projects'. The user can 'Save' or 'Cancel' a 'Part' entry, similarly, within the Flyout box. New part creation can be triggered from Command Ribbon icon 'New Part' (Step 114). Like the step to establish a 'New Project' described above, a key step (Step 124) necessary to establish a 'Part' is to link the 'Part' to a 'Part File' held in memory and accessible by defining the path to the part file and entering it into the Flyout's text box or actioning a browse button '. . . '. This step designates the location in memory of the 'Part' that the method will 'retrieve' as described later.

Materials GUI

Figure 12:
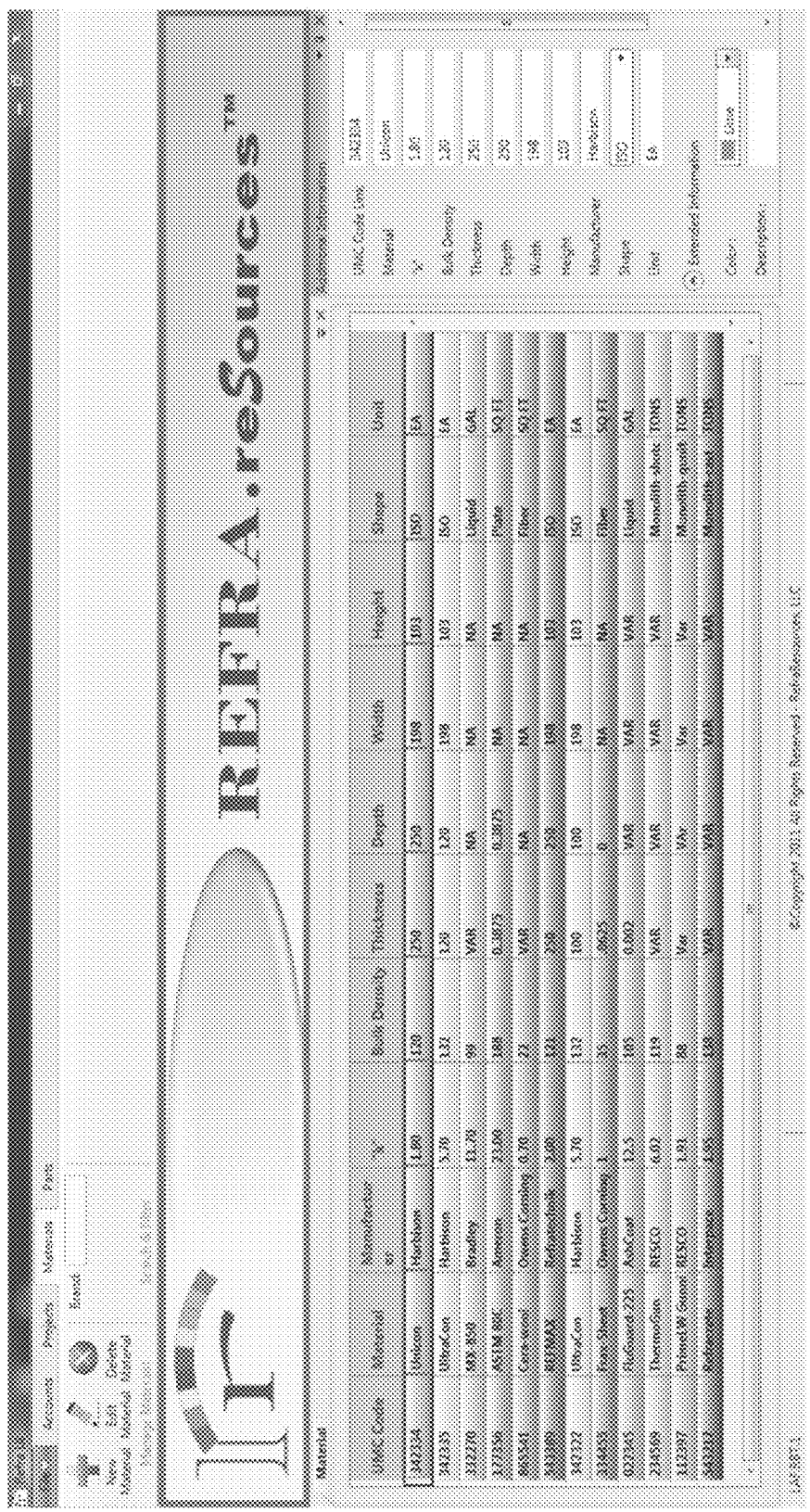
FIG. 12 shows a 'Materials' GUI displayed by an application performing the build-out tracking method.

The build-out tracking method records the physical properties of materials used on 'Projects' for 'Accounts'. The 'Materials' GUI (see FIG. 12) is displayed by selecting the 'Materials' tab on the toolbar. Any material with different physical properties, or of a different brand or manufacturer, is de-fined as a unique 'Material'. Each unique 'Material' is assigned a unique color/pattern (used as a visual identifier in the GUI) and a unique identifying number called the 'UMC Code'. The GUI lists materials by row. Displayed in columns are important physical properties ['k' thermal conductivity, bulk density, width/depth/height (if installed in uniform sub units like bricks)], the material's name and manufacturer, a 'Shape' column indicating the nature of its application or physical state (ISO shape, liquid, sheet, monolith, plate, etc.) and the units of measurement for reporting material quantity (i.e. ea., gallons, tons, etc.). The Flyout entries are saved by selecting a 'Save' icon. The 'Material' is thus established and displayed (color/pattern coded) as a row on GUI table. Alternately, the 'Cancel' icon can be selected erasing the Flyout entry. Unique to the 'Materials' GUI, deleting a material is not allowed if a 'Part' is dependent on its use. Selecting the 'Delete Material' icon may bring forth a dialogue box stating that parts related to that material must be deleted before the material may be deleted.

The build-out tracking method provides 'Search & Filter' capability to speed data retrieval within any GUI. All GUI's described above are sortable by column.

Ray Tracing Filter Method

The ray tracing filter method 200 allows the return of precise documentation of historical changes within complex or repeatedly modified build-outs. It identifies precise installation data (configurations) at any spatial point the user chooses to query within the build-out. It allows an immediate record of current in situ and legacy configurations of shape geometries, solving the technical problem created when a surface could not be rendered into the zero-Gaussian developed surface.

Figure 13:
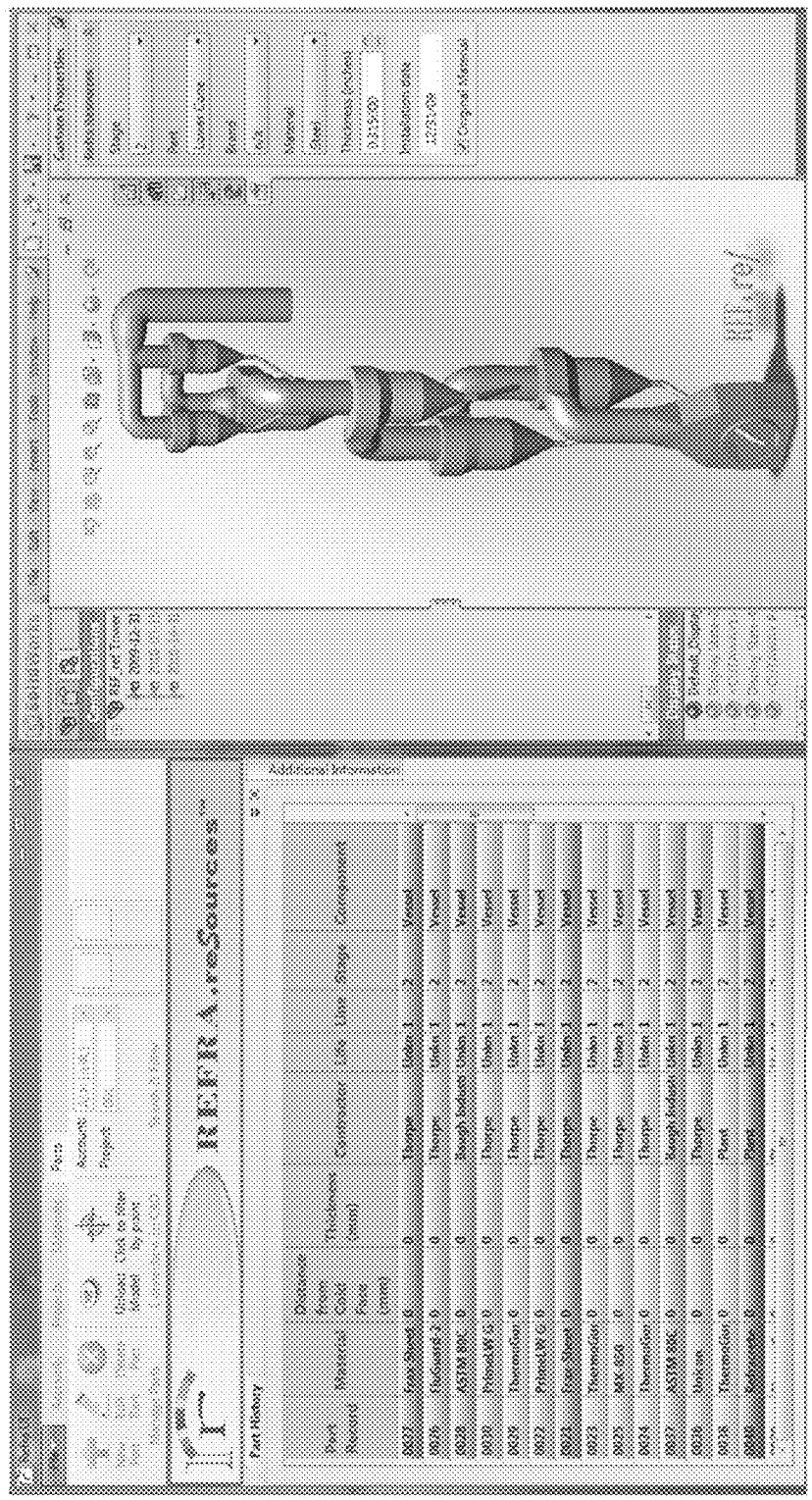
FIG. 13 shows the 'Parts' GUI displayed by an application performing the build-out tracking method.

To begin the ray tracing filter method 200, the user accesses the 'Parts' tab (Step 126) (after selecting an 'Account' and a 'Project'). In the 'Parts' GUI, the Command Ribbon shows a grouping titled 'Connection to CAD'. Within the group, the 'Load CAD Model' icon is the icon active. When the user selects the 'Load CAD Model' icon (Step 130), the build-out tracking method uses the unique path stored in the DB to load and display a parametric build-out model associated with the Account/Project (Step 132). The build-out tracking method shrinks the size of the GUI and displays to its right a dimensionally identical user interface from the 3D parametric modeling application (3DPMA) with one of the configurations of the parametric build-out model displayed and active (see FIG. 13). The user navigates to a point on a surface of the model and selects that point as a 'Base Point' (BP) (Step 134). The user returns to the 'Parts' GUI and selects the 'Click to filter by point' icon which has become active following the 'Load Model' action (Step 136). The build-out tracking method 100 then begins to execute its ray tracing filter method 200 (See FIG. 2), passing the parametric build-out model and Base Point (BP) to the ray tracing filter method 200 (Step 202).

The ray tracing filter method 200 then creates a ray (referred to as $Ray_n$) normal to the surface of the model at the Base Point (BP) in the general direction of (i.e., not away from) a central axis (CX) of the model (Step 204). Then, the ray tracing filter method 200 collects the configurations of the parametric build-out model and creates a list of configurations (Step 206). The first configuration (or next configuration, in subsequent iterations) in the model is selected (Step 208). The method reviews the configuration and inventories the parts making up this configuration (Step 210). It then creates a first list of parts that are intersected by $Ray_n$ (Step 212). The method then calculates a half-face distance (HFD), defined as a distance from the Base Point (BP) and a point intersected by $Ray_n$ on the furthest extreme face away from the Base Point (Step 214). From the list of parts the method creates a list of faces intersected by $Ray_n$ (Step 216).

Figure 3:
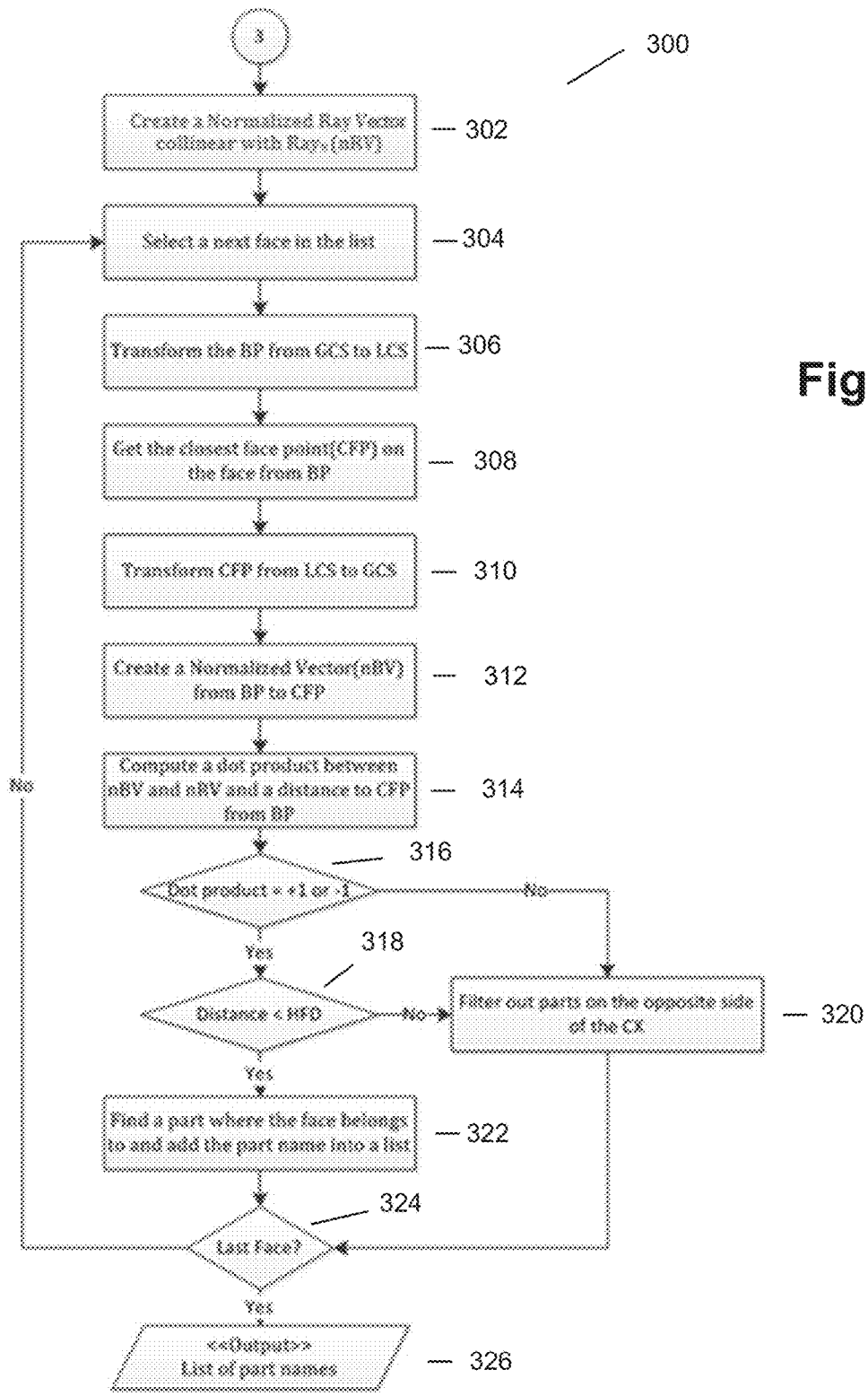
FIG. 3 is a flow chart of a second part of the ray tracing filter method of FIG. 2.
Figure 4:
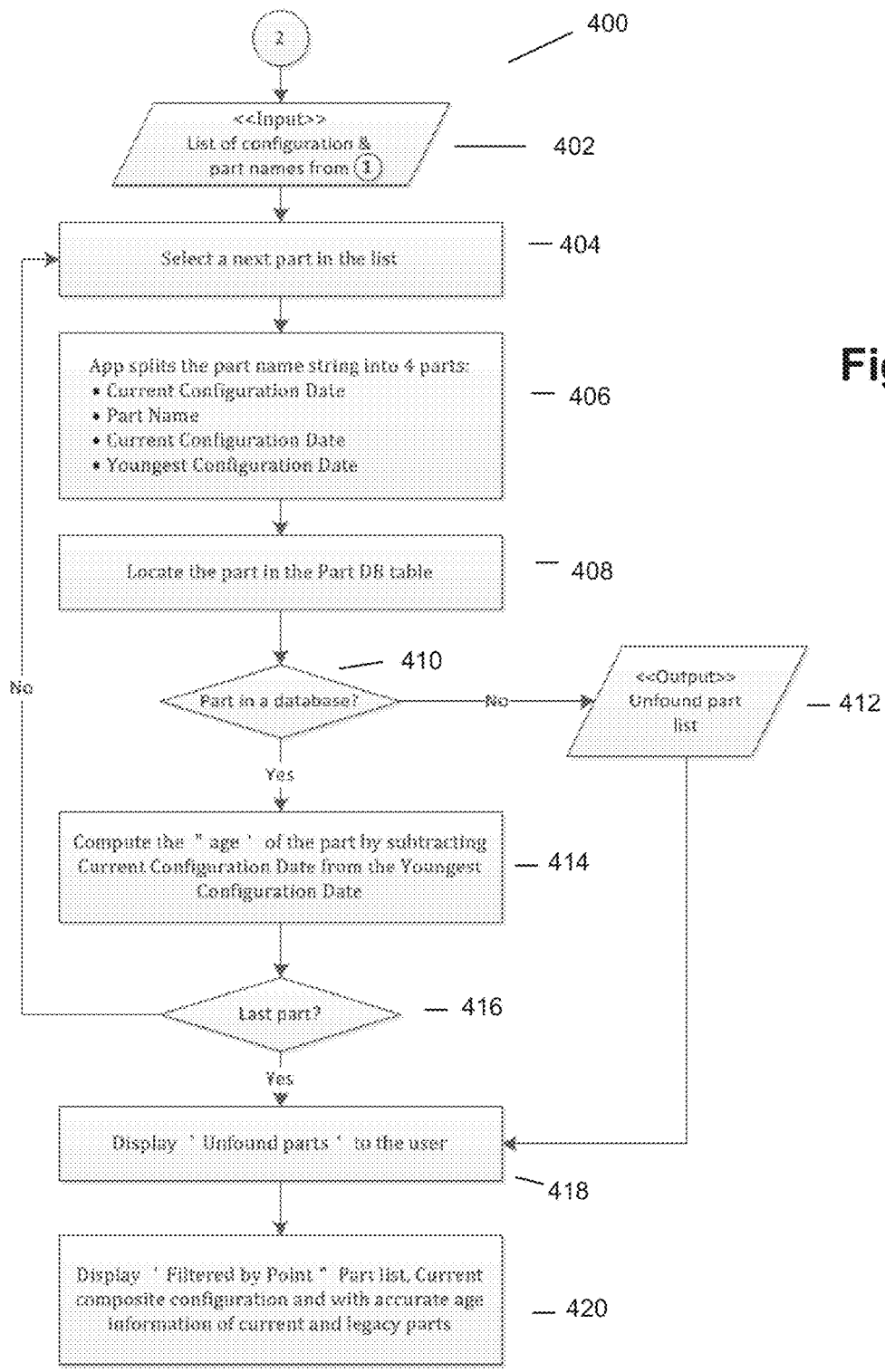
FIG. 4 is a flow chart of a method of matching filtered parts with database information.
Figure 5:
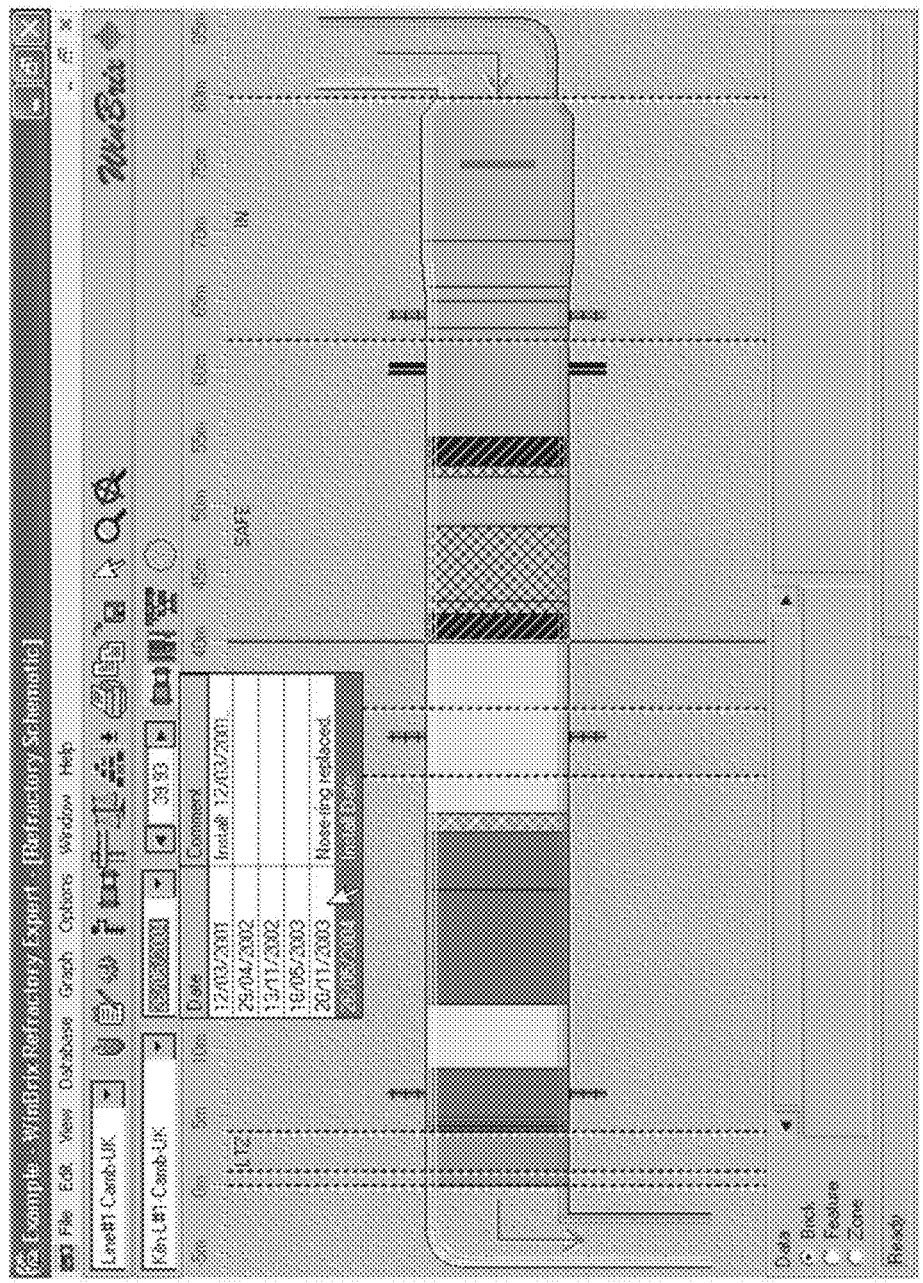
FIG. 5 (Prior Art) is an illustration of a GUI of a prior art application for tracking cylindrical structures in 2D.
Figure 6:
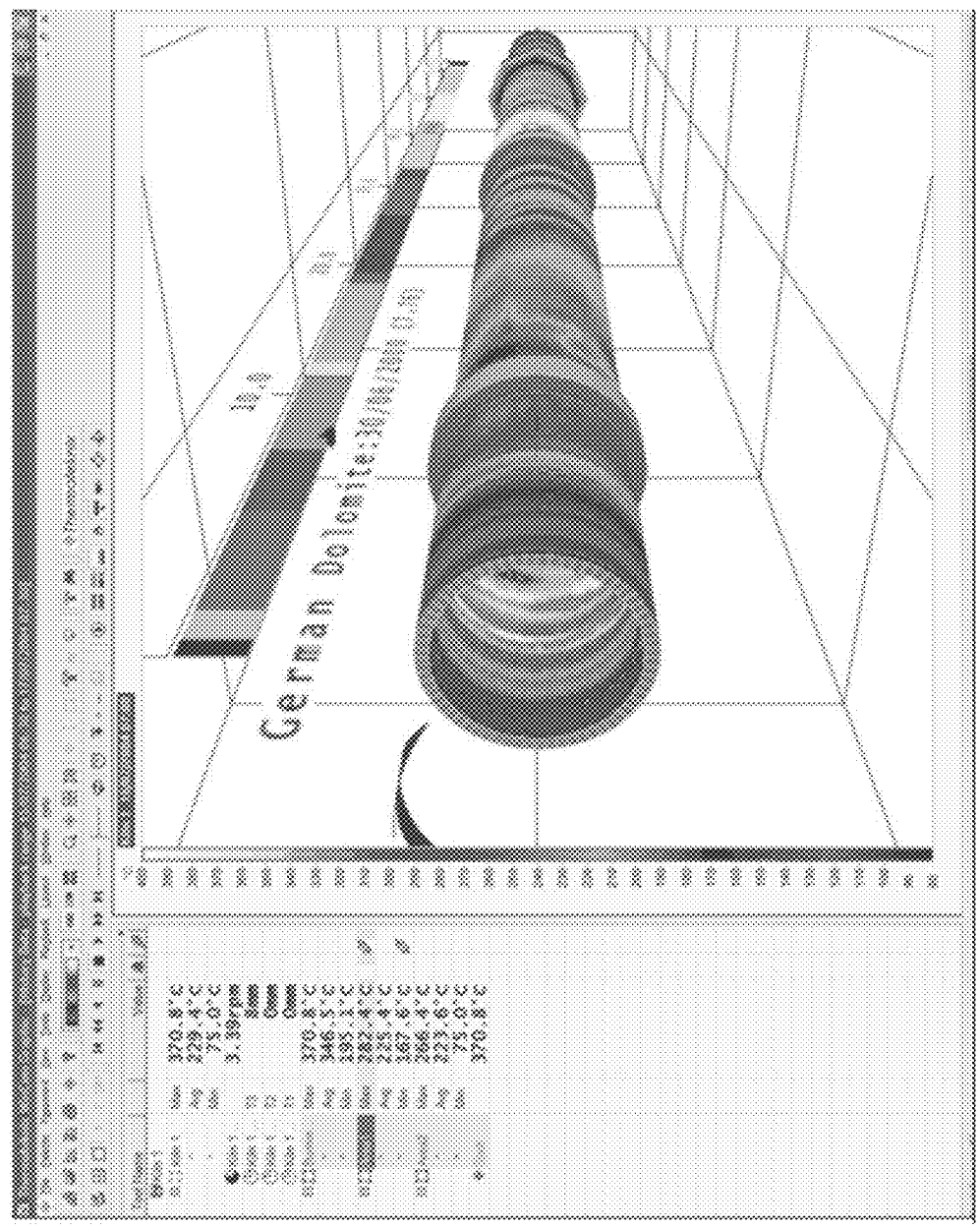
FIG. 6 (Prior Art) is an illustration of a GUI of another prior art application for tracking cylindrical structures in 3D.
Figure 7:
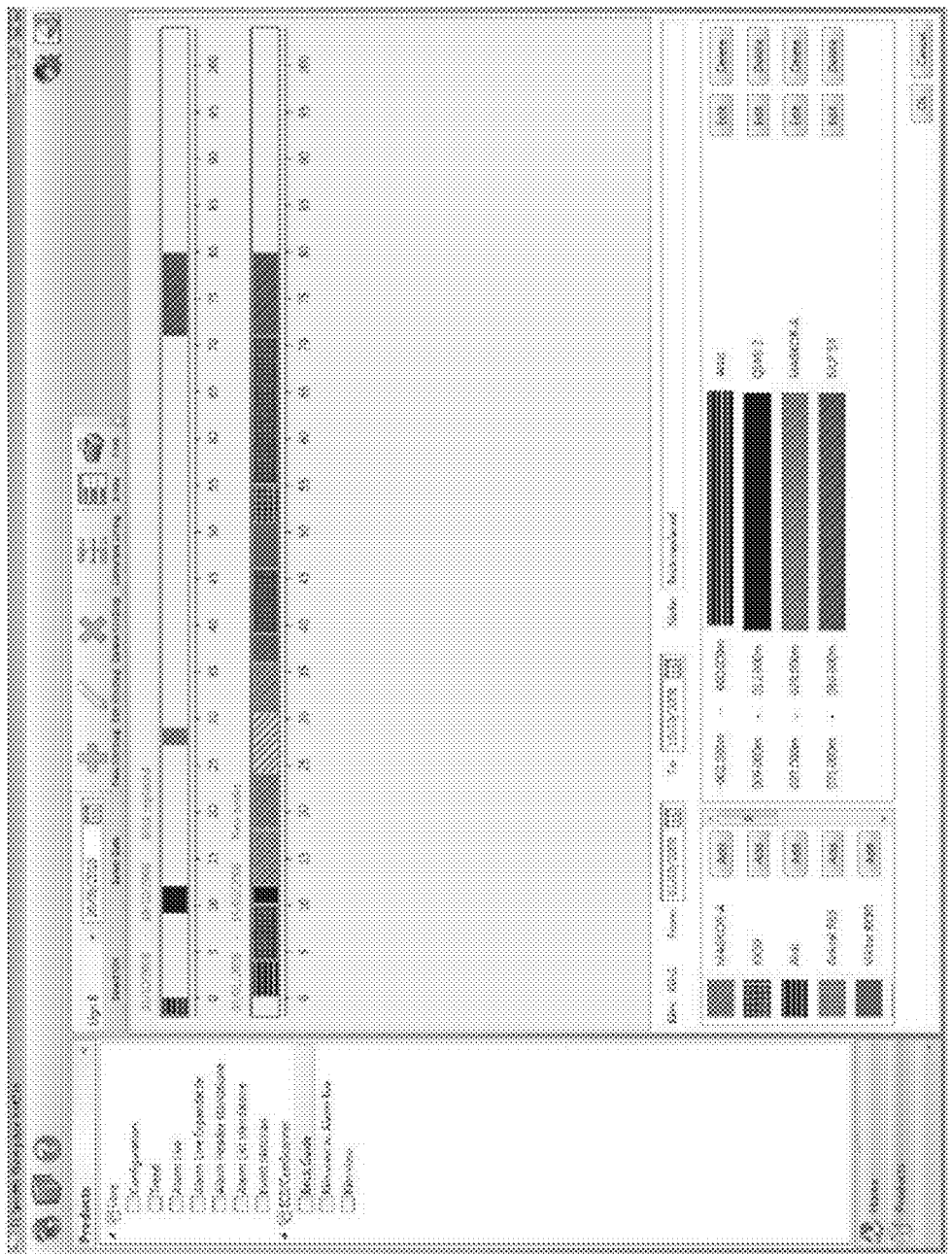
FIG. 7 (Prior Art) is an illustration of a GUI of a prior art application for tracking cylindrical structures in 2D.
Figure 8:
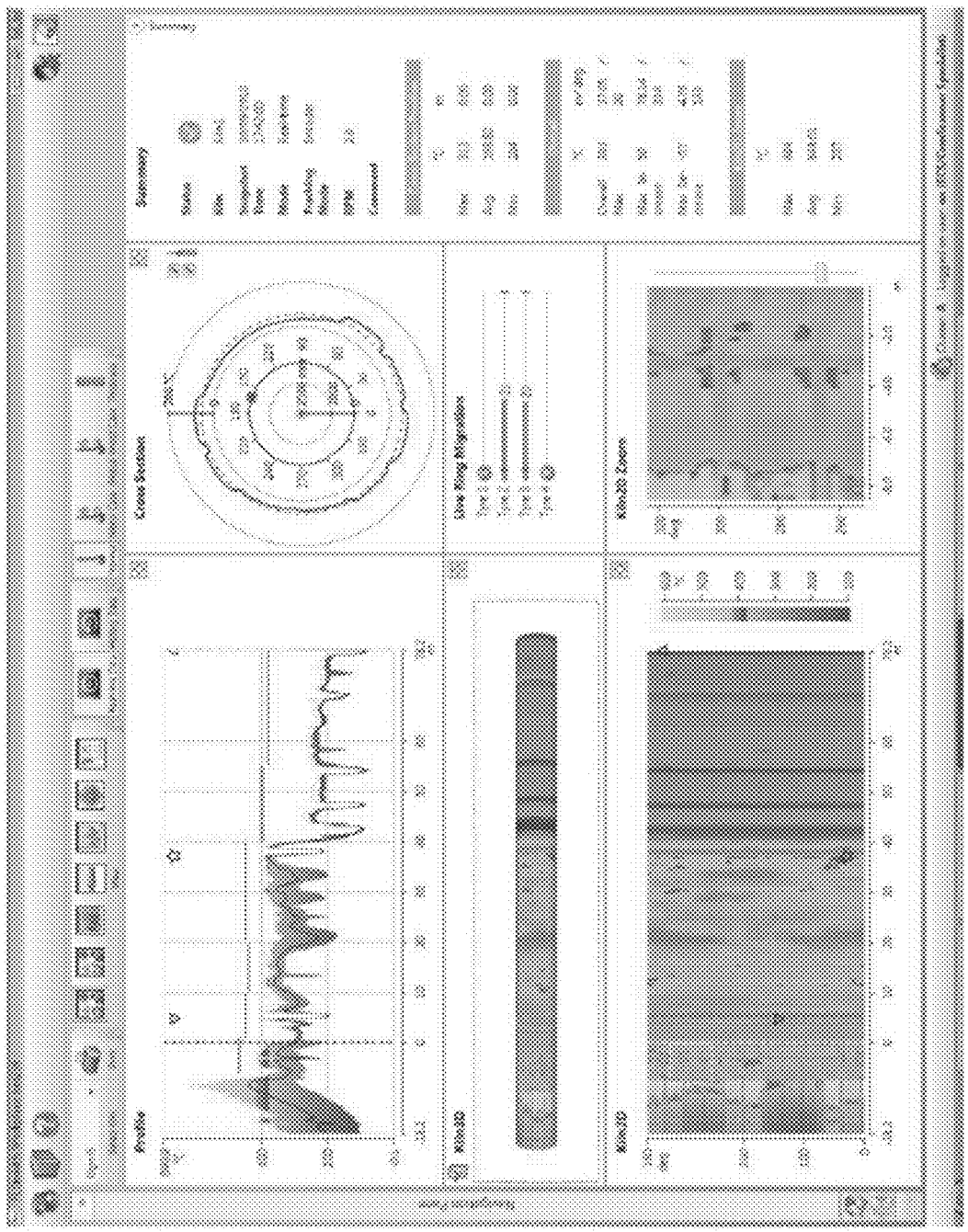
FIG. 8 (Prior Art) is an illustration of a GUI of another prior art application for tracking cylindrical structures in 3D.

In step 218, the method filters out parts that the ray intersects on the 'opposite side' of the central axis as shown in detail in the subordinate method 300 (steps 302-326) of FIG. 3. The method creates a Normalized Ray Vector (referred to as nRV) initiating at the Base Point (BP) and collinear with $Ray_n$ (Step 302). The method then selects the first face (or next face in subsequent iterations) in the list of faces (Step 304). For each selected face the method transforms the global coordinates of the Base Point (BP) into the local coordinates of the part associated with the selected face (referred to as $BP_{Local}$) (Step 306). The method determines a closest point from $BP_{Local}$ to the selected face and designates it as the Closest Face Point, Local (referred to as $CFP_{Local}$) (Step 308) and then transforms $CFP_{Local}$ back global coordinates (referred to as CFP) (Step 310). The method creates a normalized vector (referred to as nBV) from the Base Point BP to Closest Face Point CFP (Step 312). The method then computes a dot product between nBV and nRV and a distance to CFP from Base Point (BP) (Step 314). In step 316, if the dot product magnitude equals other than 1, this Part's face is not normal to nRV, it must be on the opposite side of the center axis and is rejected (Step 320). If the dot product is +1 or −1, the selected face is parallel and the method then examines the distance from BP to CFP (Step 318). If it is greater than half the distance between the selected face and the farthest outer face intercepted by Ray, (the half face distance or HFD calculated in step 214) the Part is likewise rejected for being on the opposite side (Step 320). But, if the Base Point (BP) to CFP distance is no greater than the HFD, this Part is added to a second list of parts (Step 322). In step 324, the method determines if the face just evaluated was the last in the list of faces. If it was not the last face, steps 304-324 are repeated. If it was the last face, the list of filtered part names is returned by the method (Step 326).

Figure 2:
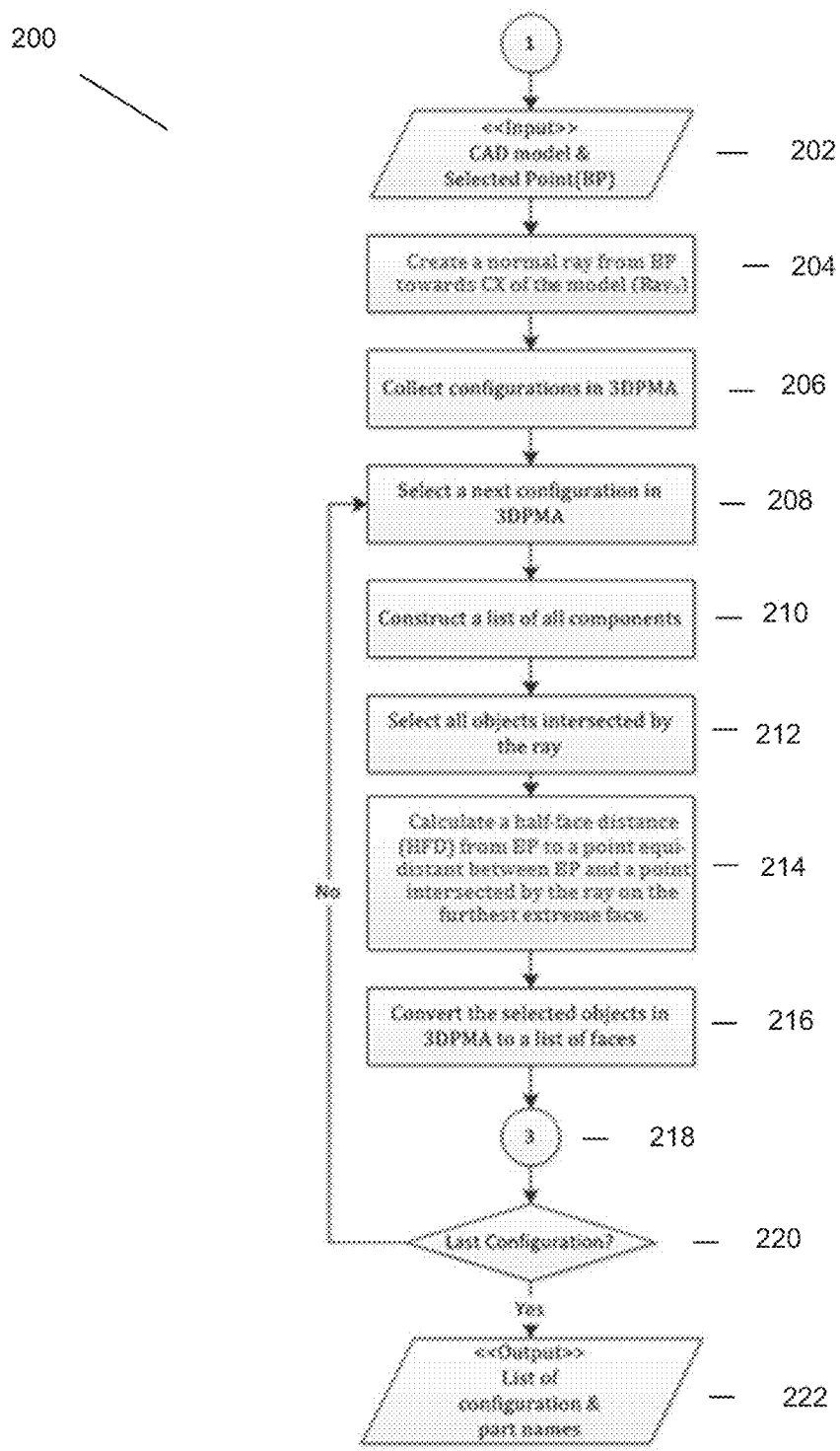
FIG. 2 is a flow chart of a ray tracing filter method.

Next, returning the steps in FIG. 2, the method in step 220 determines if the configuration just evaluated was the last configuration in the list of configurations. If it was not, then steps 208-220 are repeated. If it was the last configurations, then the filtered second list of parts for Ray, is returned (Step 222). When added to the 'List of Parts' the method renames them with a sub-name consisting of four parts; <Current Configuration Name>:<Part name>:<Current Configuration Date>:<Youngest Configuration this Part exists in>.

The method now compares one part from the second list with the parts in the 'Parts' database of information about parts (Step 410). The failure to match indicates that the part along the ray has not been properly linked into the Data Base and that part is added to an 'Unfound Parts' list (Step 412). If a match does occur, the age of the part is computed by subtracting its current configuration date from the youngest configuration date where the part was first identified (Step 414). In step 416, the method determines whether the part just evaluated was the last part in the second list of parts. If it was not, then steps 404-416 are repeated. If it was the last part, then the 'Unfound Parts List' is displayed to the user who needs to take action to acknowledge message ('OK') (Step 418).

Figure 14:
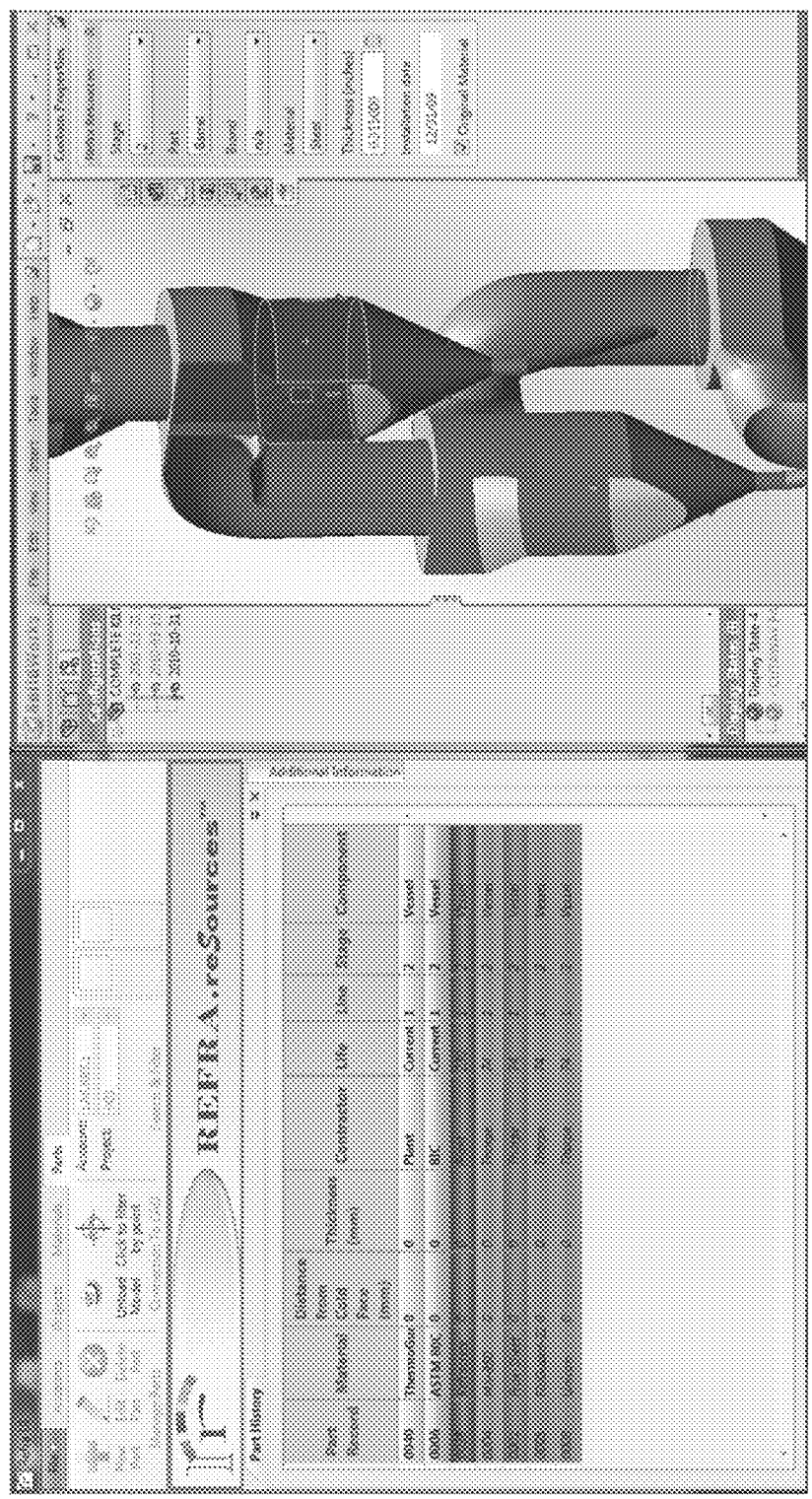
FIG. 14 shows the 'Parts' GUI displaying the 'Filtered by Point' results.

The method next returns in the display the 'Filtered by Point' results in the 'Parts' GUI configuration (Step 420). (FIG. 14). Now however, only those parts that exist or had existed along the path of the ray are displayed. Parts in the current configuration (legacy parts) are displayed on rows with shaded backgrounds and in unbold, italic fonts. These parts also show the duration of its in-service 'LIFE' in days. Parts comprising the current in situ configuration display 'CURRENT' in the 'LIFE' column, and are displayed in bold font on rows with bright unshaded backgrounds. The user can utilize the returned data as needed (Step 144).

The method remains available for the selection of another Base Point (BP) point on the same model and the data is returned by means identical to that described above (Step 148). If another point is not desired, the method requires that the model be 'unloaded' and returning its 3DPMA build-out file to memory, saving any changes made to the build-out while it was in use by the method (Step 150). The user actions the 'Unload Model' icon from the Command Ribbon 'Connection to CAD' group and the user interface from the 3DPMA closes. The application remains open and available for other 'Project' or 'Account' selections or it can be closed (Step 152). The method saves data changes made within the application so closing the application is accomplished by simply actioning the 'Exit' button, an app File\Exit action or closing the application from the Windows Explorer® toolbar.

Those skilled in the art will recognize that numerous modifications and changes may be made to the preferred embodiment without departing from the scope of the claimed invention. It will, of course, be understood that modifications of the invention, in its various aspects, will be apparent to those skilled in the art, some being apparent only after study, others being matters of routine mechanical, chemical and electronic design. No single feature, function or property of the preferred embodiment is essential. Other embodiments are possible, their specific designs depending upon the particular application. As such, the scope of the invention should not be limited by the particular embodiments herein described but should be defined only by the appended claims and equivalents thereof.

What is claimed is:

1. A non-transient computer readable medium encoded with instructions that when executed by a processor causes the processor to perform the steps of:
   causing a display to display a configuration of a build-out model in a model graphical user interface on the display, the build-out model comprising a plurality of parts, wherein the parts are components of the build-out model that have an outer face parallel to an outer surface of the buildout model;
   accepting input from a user in which the user navigates within the model graphical user interface on the display to a point on the outer surface of the build-out model and accepting input from the user which selects that point as the base point;
   creating a ray $Ray_n$ normal to the outer surface of the build-out model at the base point in a general direction of a central axis of the build-out model; selecting a next configuration in a list of configurations of the build-out model; creating a first list of parts that are intersected by $Ray_n$;
   creating a list of faces of any of the parts in the first list of parts that are intersected by $Ray_n$;
   calculating a half-face distance, equal to half a distance between the base point and a farthest outer face intercepted by $Ray_n$;
   creating a second list of parts consisting of those parts in the first list of parts that have an outer surface parallel to the outer surface of the build-out model and that $Ray_n$ intersects on a near side of the central axis from the base point; returning to the step of selecting the next face and repeating that step and the following steps, if the selected face is not a last face in the list of faces; returning to the step of selecting the next configuration and repeating that step and the following steps, if the selected configuration is not a last configuration in the list of configurations; and
   displaying the second list of parts.

2. The non-transient computer readable medium of claim 1, wherein the step of creating the second list of parts further comprises the steps of:
   creating a normalized vector nRV initiating at the base point and collinear with $Ray_n$;
   selecting the next face in the list of faces;
   finding a closest face point on the selected face that is closest the base point;
   creating a normalized vector nBV from the base point to the closest face point;
   computing a dot product between nBV and nRV;
   if the dot product is 1 or −1, then determining if a distance from the base point to the closest face point is no greater than the half-face distance and if so, then adding a part associated with the selected face for inclusion in the second list of parts; and
   returning to the step of selecting the next face and repeating that step and the following steps, if the selected face is not a last face in the list of faces.

3. The non-transient computer readable medium of claim 2, wherein the step of creating the second list of parts further comprises the steps of:
   transforming global coordinates of the base point into local coordinates of the part associated with the selected face;
   designating a closest face point on the selected face that is closest the base point; and
   transforming the closest face point into global coordinates.

4. The non-transient computer readable medium of claim 1, further comprising instructions that when executed by the processor causes the processor to perform the steps of:
   comparing parts in the second list of parts with parts in a parts database; and
   computing an age of at least one part in second list of parts, if the part has a matching part in the parts database, by subtracting a current configuration date of the part from a youngest configuration date where the part was first identified.

5. A build-out tracking method performed by a processor, a memory and a display comprising:
   displaying a configuration of a build-out model in a model graphical user interface on the display, the build-out model comprising a plurality of parts, wherein the parts are components of the build-out model that have an outer face parallel to an outer surface of the build-out model;
   accepting input from a user in which the user navigates within the model graphical user interface on the display to a point on the outer surface of the build-out model and accepting input from the user which selects that point as the base point;
   creating a ray $Ray_n$ normal to the outer surface of the build-out model at the base point in a general direction of a central axis of the build-out model; selecting a next configuration in a list of configurations of the build-out model; creating a first list of parts that are intersected by $Ray_n$;
   creating a list of faces of any of the parts in the first list of parts that are intersected by $Ray_n$;
   calculating a half-face distance, equal to half a distance between the base point and a farthest outer face intercepted by $Ray_n$;

creating a second list of parts consisting of those parts in the first list of parts that have an outer surface parallel to the outer surface of the build-out model and that $Ray_n$ intersects on a near side of the central axis from the base point;

returning to the step of selecting the next configuration and repeating that step and the following steps, if the selected configuration is not a last configuration in the list of configurations; and displaying the second list of parts.

6. The build-out tracking method of claim 5, further comprising the steps of:

displaying a parts graphical user interface on the display; and upon command from the user, shrinking the parts graphical user interface on the display and displaying the model graphical user interface with the configuration of the build-out model on the display next to the parts graphical user interface.

7. The build-out tracking method of claim 5, wherein creating the second list of parts further comprises the steps of:

creating a normalized vector nRV initiating at the base point and collinear with $Ray_n$;

selecting the next face in the list of faces;

finding a closest face point on the selected face that is closest the base point;

creating a normalized vector nBV from the base point to the closest face point;

computing a dot product between nBV and nRV;

if the dot product is 1 or −1, then determining if a distance from the base point to the closest face point is no greater than the half-face distance and if so, then adding a part associated with the selected face for inclusion in the second list of parts; and returning to the step of selecting the next face and repeating that step and the following steps, if the selected face is not a last face in the list of faces.

8. The build-out tracking method of claim 7, wherein creating the second list of parts further comprises:

transforming global coordinates of the base point into local coordinates of the part associated with the selected face;

designating a closest face point on the selected face that is closest the base point; and transforming the closest face point into global coordinates.

9. The build-out tracking method of claim 5, further comprising:

comparing parts in the second list of parts with parts in a parts database; and computing an age of at least one part in second list of parts, if the part has a matching part in the parts database, by subtracting a current configuration date of the part from a youngest configuration date where the part was first identified.

* * * * *